United States Patent
Nagel et al.

(10) Patent No.: US 11,005,031 B2
(45) Date of Patent: May 11, 2021

(54) STACKED MAGNETORESISTIVE STRUCTURES AND METHODS THEREFOR

(71) Applicant: Everspin Technologies, Inc., Chandler, AZ (US)

(72) Inventors: Kerry Nagel, Scottsdale, AZ (US); Sanjeev Aggarwal, Scottsdale, AZ (US)

(73) Assignee: Everspin Technologies, Inc., Chandler, AZ (US)

( * ) Notice: Subject to any disclaimer, the term of this patent is extended or adjusted under 35 U.S.C. 154(b) by 6 days.

(21) Appl. No.: 16/561,418

(22) Filed: Sep. 5, 2019

(65) Prior Publication Data

US 2020/0075843 A1 Mar. 5, 2020

Related U.S. Application Data

(60) Provisional application No. 62/727,192, filed on Sep. 5, 2018.

(51) Int. Cl.
| | | |
|---|---|---|
| *H01L 43/02* | (2006.01) | |
| *H01L 43/12* | (2006.01) | |
| *H01L 27/22* | (2006.01) | |

(52) U.S. Cl.
CPC ............ *H01L 43/02* (2013.01); *H01L 27/228* (2013.01); *H01L 43/12* (2013.01)

(58) Field of Classification Search
CPC ........ H01L 43/02; H01L 27/228; H01L 43/12
See application file for complete search history.

(56) References Cited

U.S. PATENT DOCUMENTS

| | | | |
|---|---|---|---|
| 8,686,484 B2 | 4/2014 | Whig et al. | |
| 8,747,680 B1 | 6/2014 | Deshpande et al. | |
| 9,023,216 B2 | 5/2015 | Kochergin et al. | |
| 9,136,464 B1 | 9/2015 | Whig et al. | |
| 9,419,208 B2 | 8/2016 | Whig et al. | |
| 10,937,479 B1* | 3/2021 | Beery | H01L 21/02293 |
| 2011/0292714 A1* | 12/2011 | Andre | G11C 11/161 |
| | | | 365/148 |
| 2013/0201755 A1* | 8/2013 | Ezaki | G11C 11/1659 |
| | | | 365/158 |
| 2016/0225981 A1* | 8/2016 | Deshpande | H01L 43/12 |
| 2018/0158498 A1 | 6/2018 | Aggarwal et al. | |
| 2019/0067566 A1* | 2/2019 | Nagel | G11C 11/161 |
| 2019/0140019 A1* | 5/2019 | Nagel | H01L 27/226 |

OTHER PUBLICATIONS

"Materials chemistry for low-k materials," Materials Today, vol. 9, Issue 3, Mar. 2006, pp. 22-31.

* cited by examiner

*Primary Examiner* — Seahvosh Nikmanesh
(74) *Attorney, Agent, or Firm* — Bookoff McAndrews, PLLC

(57) ABSTRACT

A magnetoresistive device may include a first plurality of magnetic tunnel junction (MTJ) bits arranged in a first XY plane, and a second plurality of MTJ bits arranged in a second XY plane that is spaced apart from the first XY plane in a Z direction. And, the MTJ bits of the first plurality of MTJ bits may be spaced apart from the MTJ bits of the second plurality of MTJ bits in the X and Y directions.

20 Claims, 11 Drawing Sheets

STACKED MAGNETORESISTIVE STRUCTURES AND METHODS THEREFOR

CROSS-REFERENCE TO RELATED APPLICATIONS

This application claims the benefit of priority from U.S. Provisional Application No. 62/727,192, filed on Sep. 5, 2018, which is incorporated by reference herein in its entirety.

TECHNICAL FIELD

The present disclosure relates to, among other things, magnetoresistive devices with magnetoresistive bits, and methods for fabricating and using the disclosed magnetoresistive devices.

INTRODUCTION

There are many inventions described and illustrated herein, as well as many aspects and embodiments of those inventions. In one aspect, the present disclosure relates to magnetoresistive devices (e.g., a magnetoresistive memory device, a magnetoresistive sensor/transducer device, etc.) including multiple spaced-apart arrays of magnetoresistive bits and methods of manufacturing the described magnetoresistive devices. An exemplary magnetoresistive bit (e.g., used in a magnetic tunnel junction (MTJ) magnetoresistive device) of the present disclosure includes a stack or structure that includes multiple layers or regions of material stacked one above the other. When used in a memory device (e.g., a magnetoresistive random access memory (MRAM)), the magnetoresistive bit includes at least one non-magnetic layer (e.g., an electrically non-conductive dielectric layer, or an electrically conductive yet non-magnetic layer) disposed between a "fixed" magnetic region and a "free" magnetic region. In some aspects, each of the "fixed" magnetic region and the "free" magnetic region may include one or more layers of ferromagnetic materials.

When used in a magnetoresistive memory device, information is stored in the magnetoresistive bit by switching, programming, and/or controlling the direction of magnetization vectors in the magnetic layer(s) of the "free" magnetic region. In contrast, the magnetization vectors in the magnetic layers of the "fixed" magnetic region are magnetically fixed in a predetermined direction. The direction of the magnetization vectors in the "free" magnetic region may be switched and/or programmed (e.g., through spin transfer torque (or STT) or through spin orbit torque (SOT)) by the application of a write signal (e.g., one or more current pulses) through the magnetoresistive bit. When the magnetization vectors of the "free" magnetic region are in the same direction as the magnetization vectors of the "fixed" magnetic region, the magnetoresistive bit has a first resistance (e.g., a relatively lower resistance, $R_{Min}$). Conversely, when the magnetization vectors of the "free" magnetic region are opposite the direction of the magnetization vectors of the "fixed" magnetic region, the magnetoresistive bit has a second resistance (e.g., a relatively higher resistance, $R_{Max}$). The information stored in the magnetoresistive bit is determined or read by detecting the magnetic state of the magnetoresistive bit by passing a read current through the magnetoresistive bit to determine its resistance (e.g., ($R_{Min}$ or $R_{Max}$)).

Typical magnetoresistive devices include many magnetoresistive bits. For example, a magnetoresistive memory device (such as an MRAM) may include numerous magnetoresistive bits arranged in a planar array (e.g., in a two-dimensional array of columns and rows). By measuring the resistance of each bit, the data (e.g., the data state) stored in the memory array can be read. Typically, increasing the density of the magnetoresistive bits in a magnetoresistive device is desirable (e.g., to store more information in a reduced area). In some embodiments, the magnetoresistive devices of the current disclosure have a relatively higher density of magnetoresistive bits. The scope of the current disclosure, however, is defined by the attached claims, and not by any characteristics of the resulting device or method.

BRIEF DESCRIPTION OF THE DRAWINGS

Embodiments of the present disclosure may be implemented in connection with aspects illustrated in the attached drawings. These drawings show different aspects of the present inventions and, where appropriate, reference numerals illustrating like structures, components, materials, and/or elements in different figures are labeled similarly. It is understood that various combinations of the structures, components, and/or elements, other than those specifically shown, are contemplated and are within the scope of the present disclosure.

For simplicity and clarity of illustration, the figures depict the general structure and/or manner of construction of the various embodiments described herein. For ease of illustration, the figures depict the different layers/regions of the illustrated magnetoresistive devices as having a uniform thickness and well-defined boundaries with straight edges. However, a person skilled in the art would recognize that, in reality, the different layers typically have a non-uniform thickness. And, at the interface between adjacent layers, the materials of these layers may alloy together, or migrate into one or the other material, making their boundaries ill-defined. Descriptions and details of well-known features (e.g., interconnects, etc.) and techniques may be omitted to avoid obscuring other features. Elements in the figures are not necessarily drawn to scale. The dimensions of some features may be exaggerated relative to other features to improve understanding of the exemplary embodiments. Cross-sectional views are simplifications provided to help illustrate the relative positioning of various regions/layers and describe various processing steps. One skilled in the art would appreciate that the cross-sectional views are not drawn to scale and should not be viewed as representing proportional relationships between different regions/layers. Moreover, while certain regions/layers and features are illustrated with straight 90-degree edges, in actuality or practice such regions/layers may be more "rounded" and gradually sloping.

Further, one skilled in the art would understand that, although multiple layers with distinct interfaces are illustrated in the figures, in some cases, over time and/or exposure to high temperatures, materials of some of the layers may migrate into or interact with materials of other layers to present a more diffuse interface between these layers. It should be noted that, even if it is not specifically mentioned, aspects described with reference to one embodiment may also be applicable to, and may be used with, other embodiments.

Moreover, there are many embodiments described and illustrated herein. The present disclosure is neither limited to any single aspect nor embodiment thereof, nor to any combinations and/or permutations of such aspects and/or embodiments. Moreover, each aspect of the present disclosure, and/or embodiments thereof, may be employed alone or in combination with one or more of the other aspects of the present disclosure and/or embodiments thereof. For the sake of brevity, certain permutations and combinations are not discussed and/or illustrated separately herein. Notably, an embodiment or implementation described herein as "exemplary" is not to be construed as preferred or advantageous, for example, over other embodiments or implementations; rather, it is intended reflect or indicate the embodiment(s) is/are "example" embodiment(s). Further, even though the figures and this written disclosure appear to describe the disclosed magnetoresistive stacks in a particular order of construction (e.g., from bottom to top), it is understood that the depicted magnetoresistive stacks may have a different order (e.g., the opposite order (i.e., from top to bottom)). For example, a "fixed" magnetic region may be formed on or above a "free" magnetic region or layer, which in turn may be formed on or above an insertion layer of the present disclosure.

Figure 1:
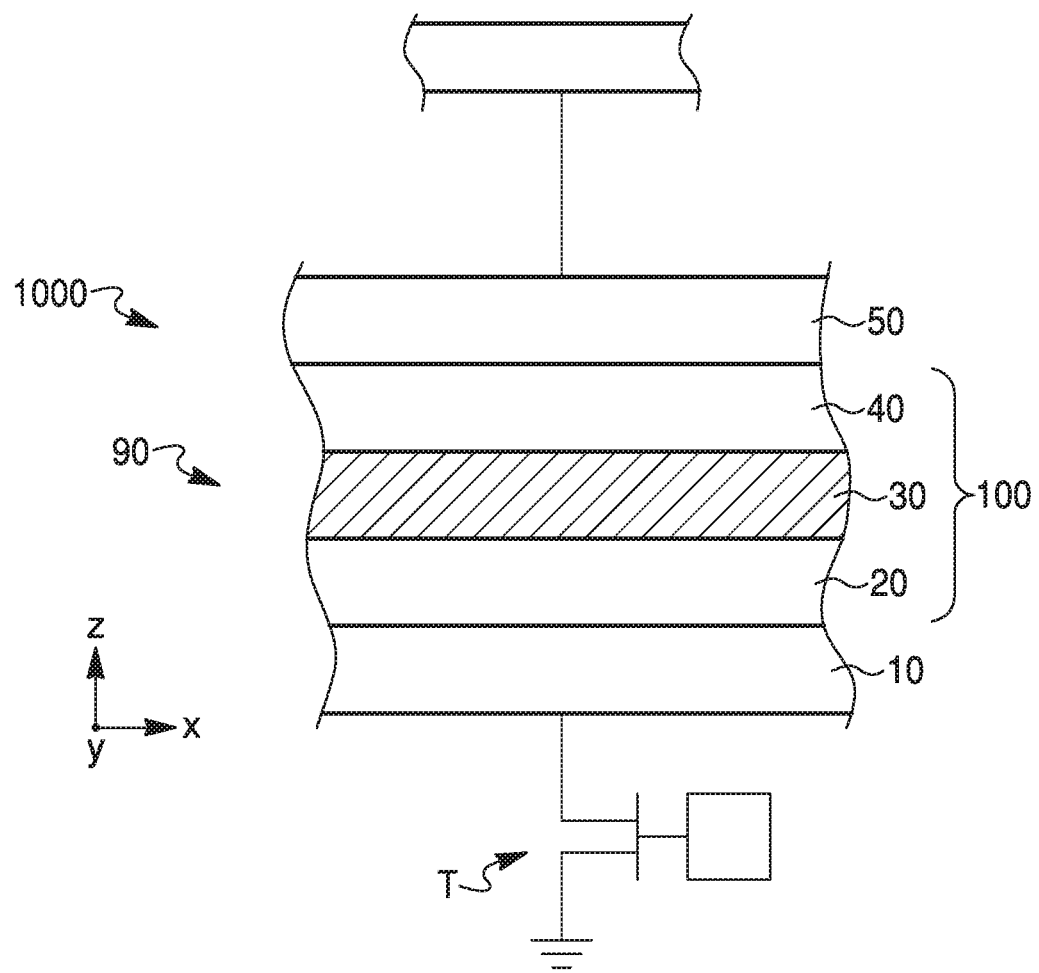
Figure 2:
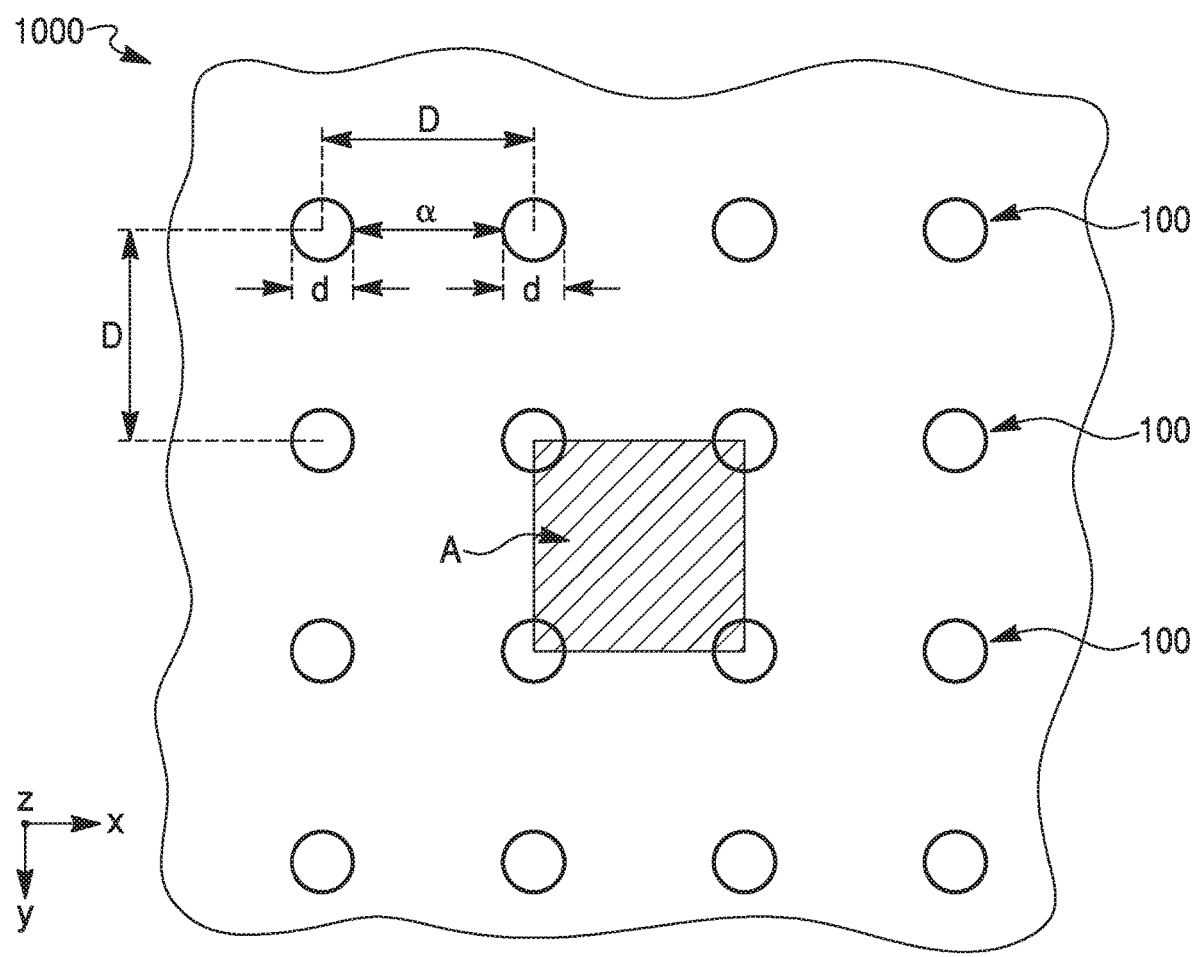
Figure 3:
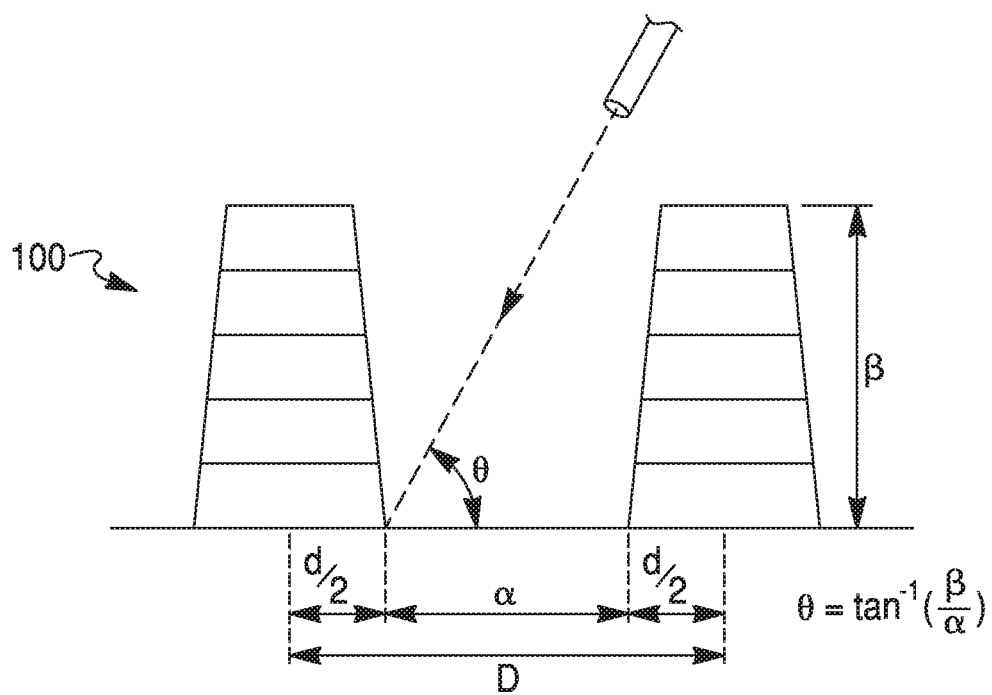
Figure 4A:
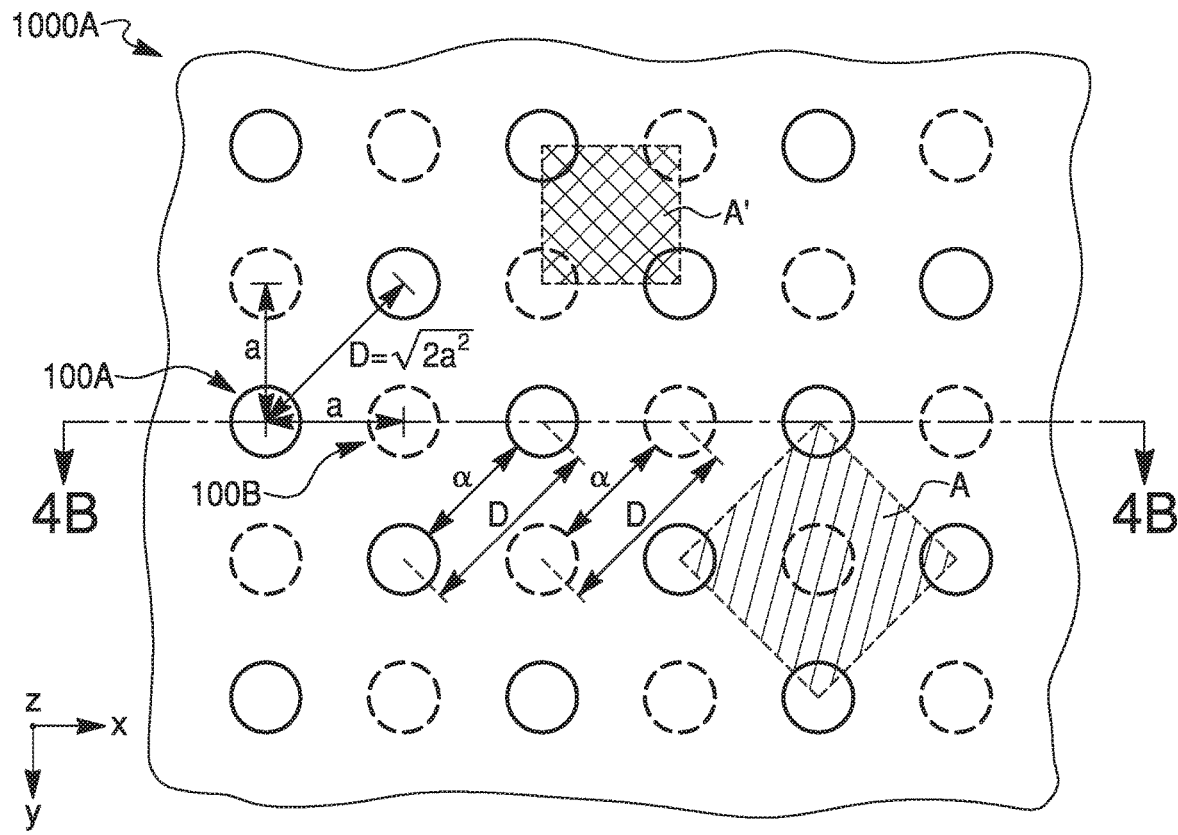
Figure 4B:
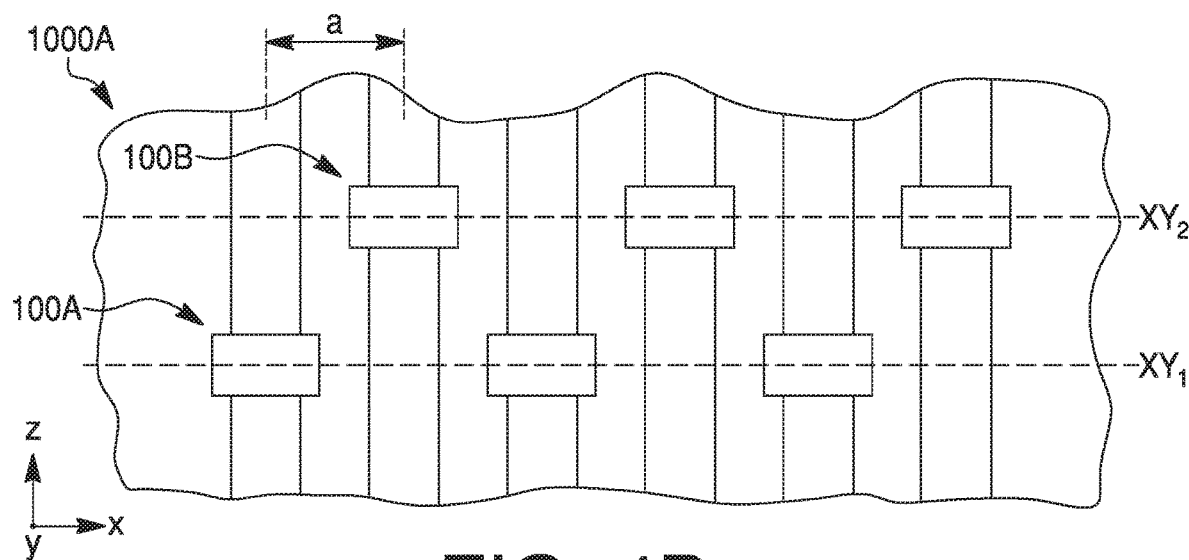
Figure 5:
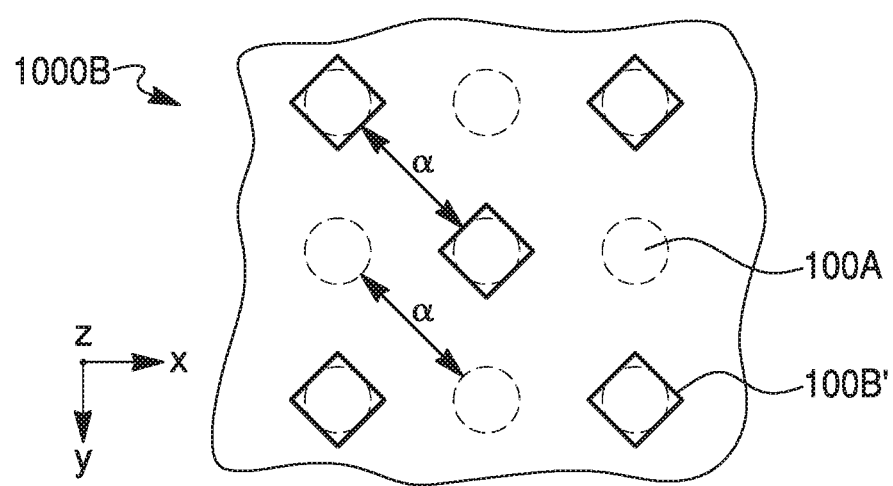
Figure 6:
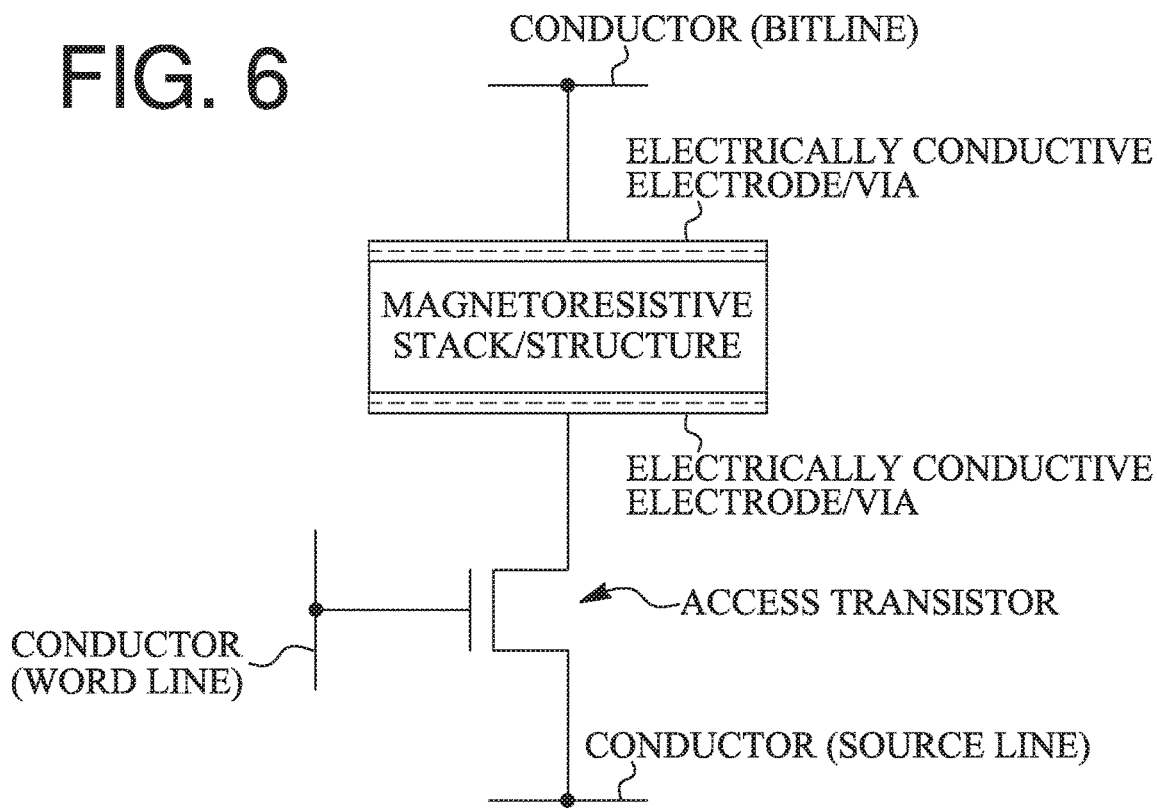
Figure 7A:
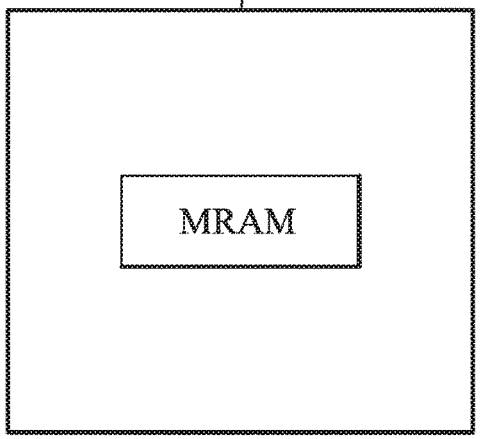
Figure 7B:
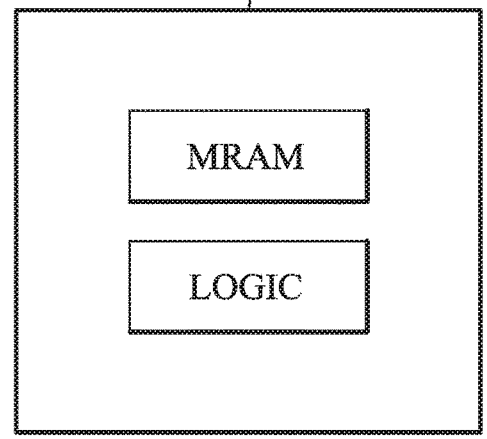
Figure 8A:
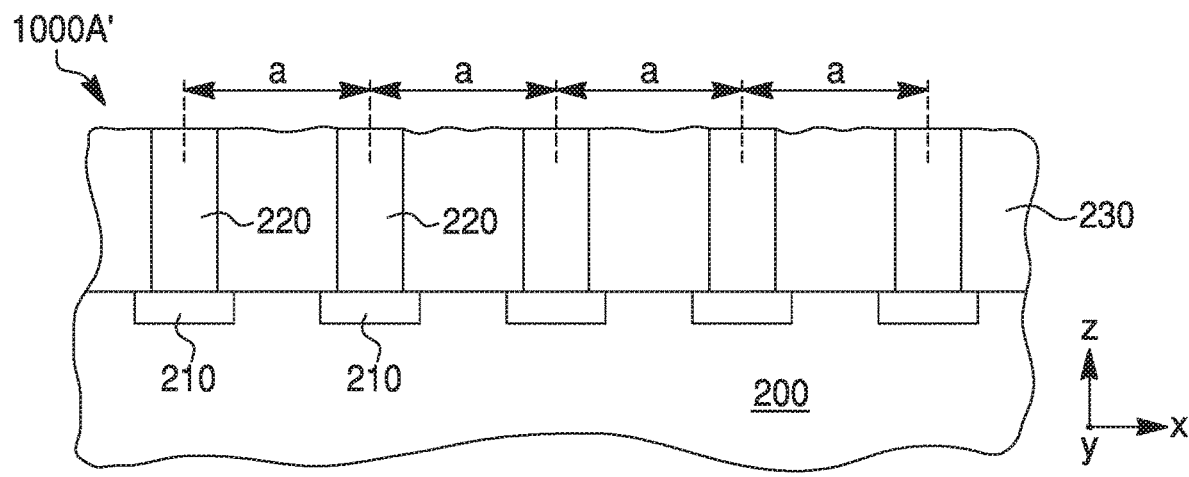
Figure 8B:
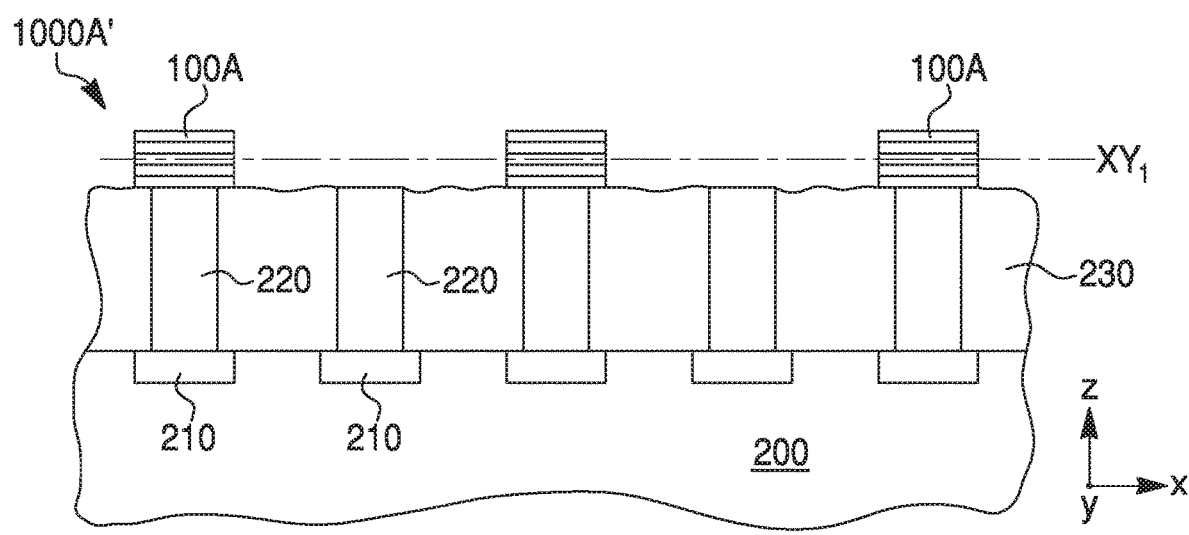
Figure 8C:
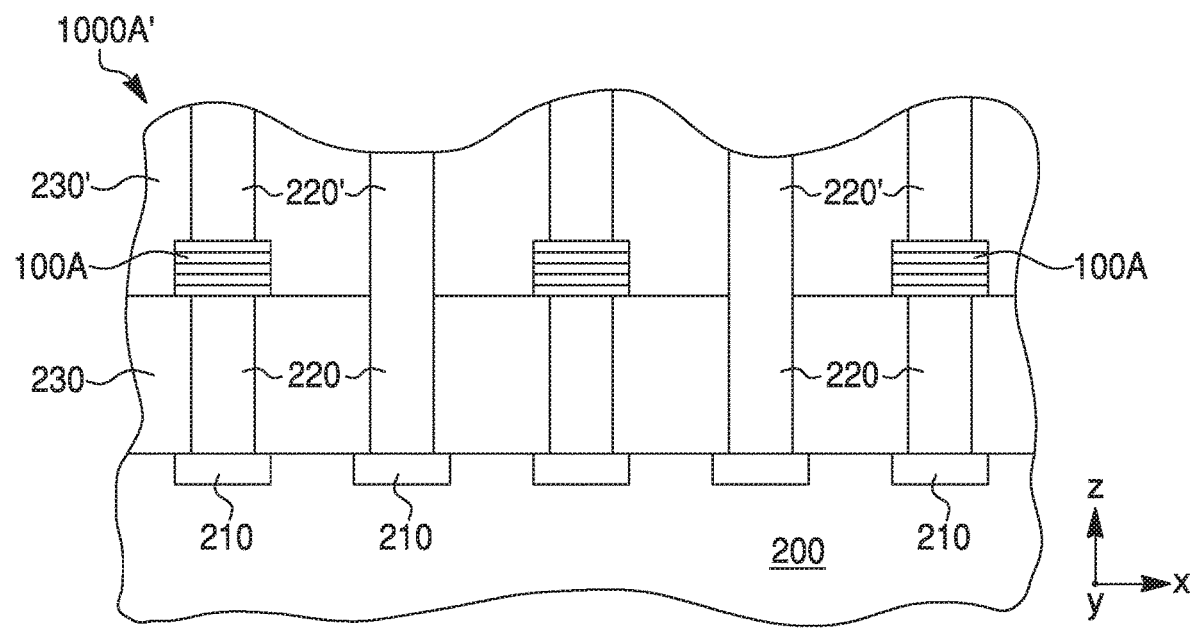
Figure 8D:
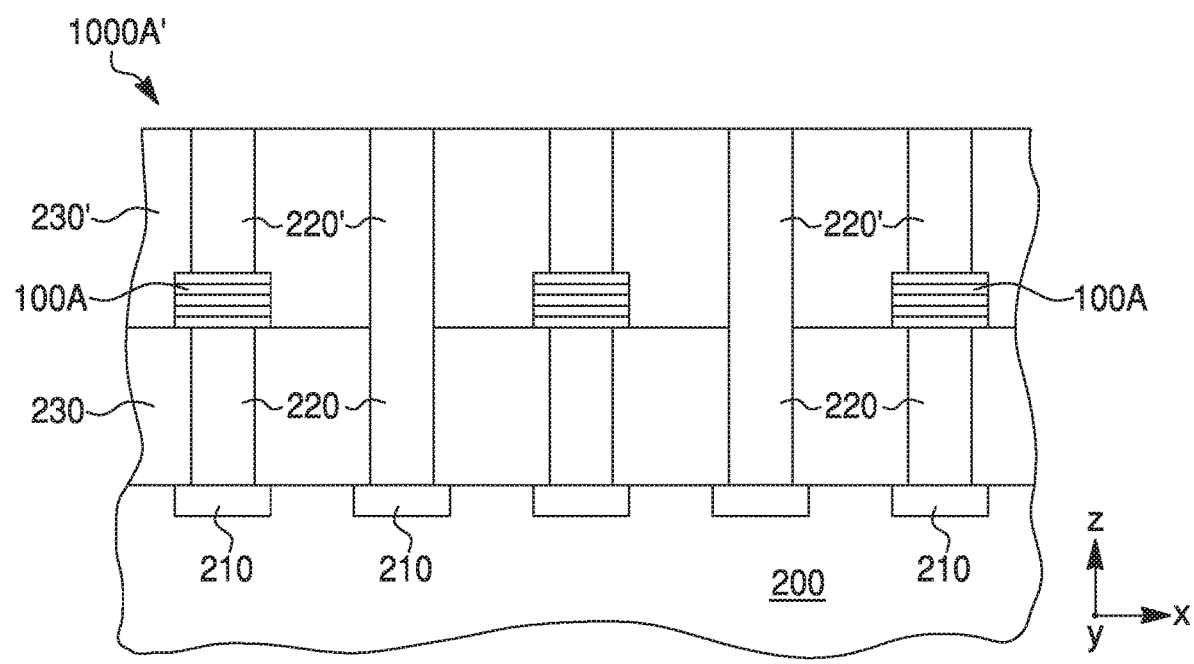
Figure 8E:
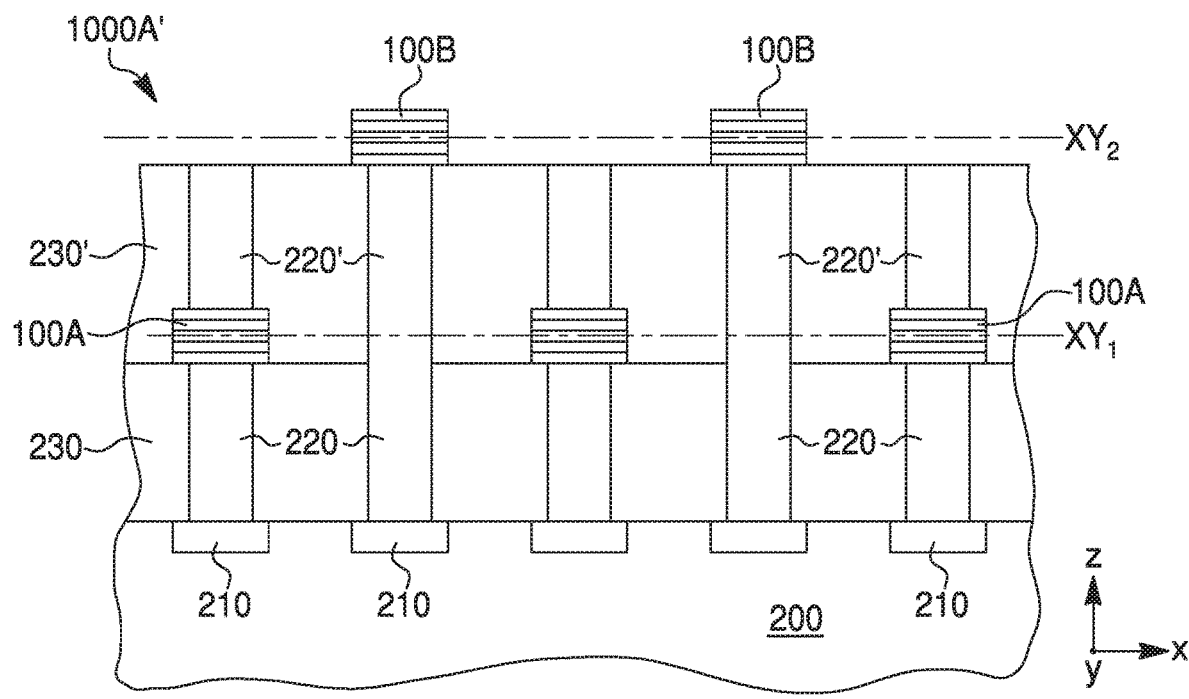
Figure 8F:
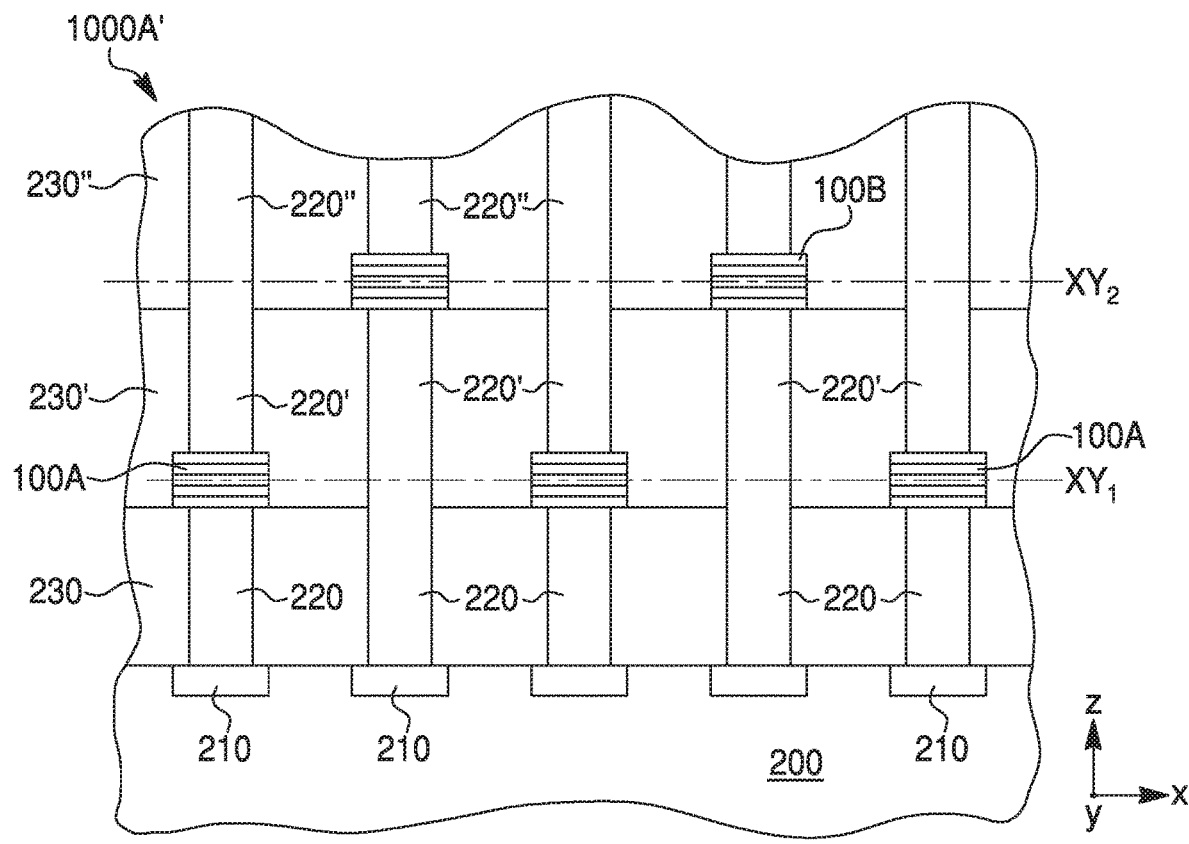
Figure 8G:
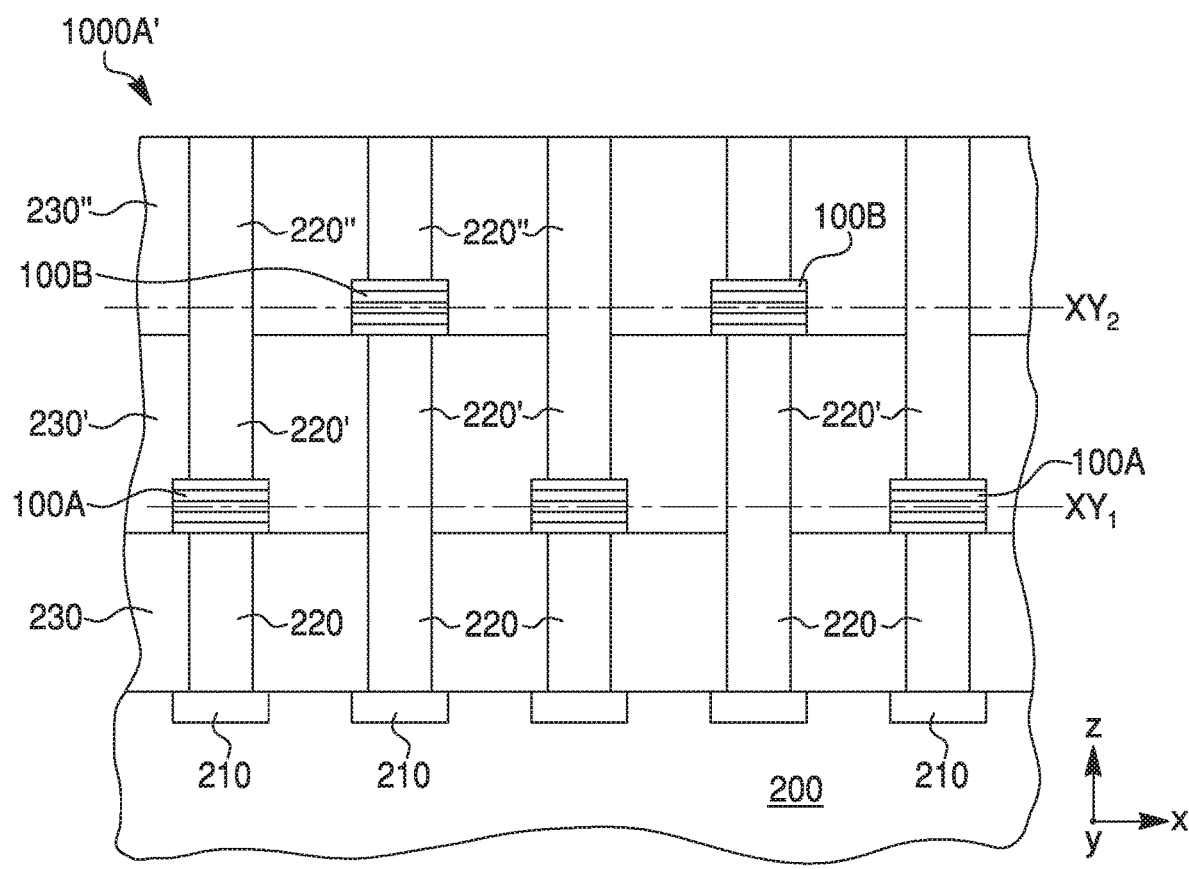
Figure 9:
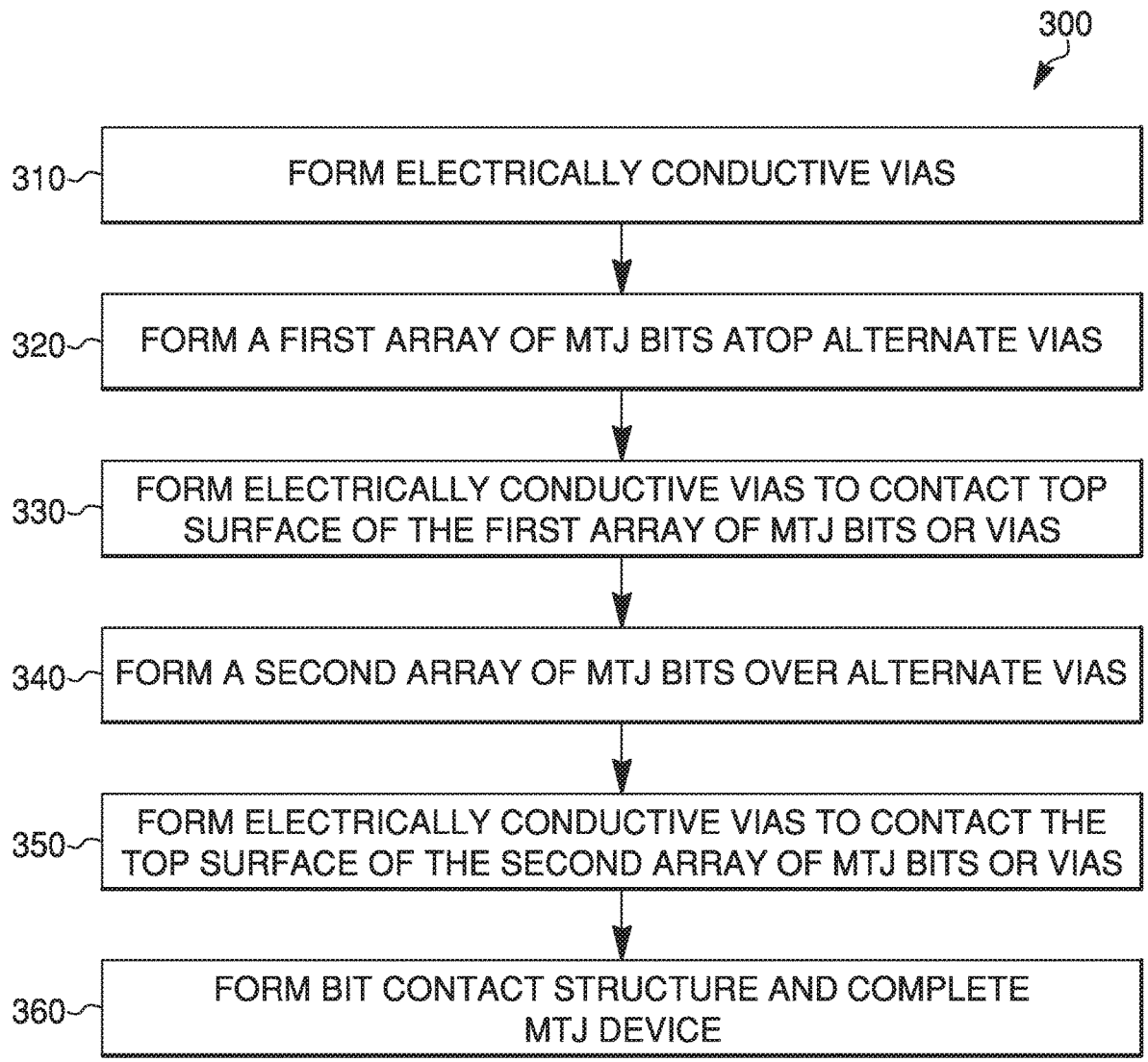

FIG. 1 is a cross-sectional view of an exemplary magnetoresistive device (MTJ device) with an exemplary magnetoresistive bit (MTJ bit) in one embodiment;

FIG. 2 is a schematic illustration of a top view of the MTJ device of FIG. 1 showing an array of MTJ bits arranged in a plane in one embodiment;

FIG. 3 schematically illustrates the effect of spacing between adjacent MTJ bits during an exemplary fabrication process used to fabricate an exemplary MTJ device;

FIGS. 4A and 4B are schematic illustrations of another embodiment of an MTJ device having arrays of MTJ bits in two different planes;

FIG. 5 is a schematic illustration of an exemplary MTJ device with MTJ bits in different planes having different shapes;

FIG. 6 is a schematic diagram of an exemplary magnetoresistive memory stack/structure electrically connected to an access transistor in a magnetoresistive memory cell configuration;

FIGS. 7A-7B are schematic block diagrams of integrated circuits including a discrete memory device and an embedded memory device, each including an MRAM (which, in one embodiment is representative of one or more arrays of MRAM having a plurality of magnetoresistive memory stacks according to aspects of certain embodiments of the present disclosure);

FIGS. 8A-8G are schematic illustrations of a partially formed MTJ device at different stages of its fabrication in one exemplary embodiment; and FIG. 9 is a simplified flow chart illustrating an exemplary method of fabricating the exemplary magnetoresistive device of FIG. 4A.

Again, there are many embodiments described and illustrated herein. The present disclosure is neither limited to any single aspect nor embodiment thereof, nor to any combinations and/or permutations of such aspects and/or embodiments. Each of the aspects of the present disclosure, and/or embodiments thereof, may be employed alone or in combination with one or more of the other aspects of the present disclosure and/or embodiments thereof. For the sake of brevity, many of those combinations and permutations are not discussed separately herein.

DETAILED DESCRIPTION

It should be noted that all numeric values disclosed herein (including all disclosed thickness values, limits, and ranges) may have a variation of ±10% (unless a different variation is specified) from the disclosed numeric value. For example, a layer disclosed as being "t" units thick can vary in thickness from (t−0.1t) to (t+0.1t) units. Further, all relative terms such as "about," "substantially," "approximately," etc. are used to indicate a possible variation of ±10% (unless noted otherwise or another variation is specified). Moreover, in the claims, values, limits, and/or ranges of the thickness and atomic composition of, for example, the described layers/regions, mean the value, limit, and/or range ±10%.

It should be noted that the description set forth herein is merely illustrative in nature and is not intended to limit the embodiments of the subject matter, or the application and uses of such embodiments. Any implementation described herein as exemplary is not to be construed as preferred or advantageous over other implementations. Rather, the term "exemplary" is used in the sense of example or "illustrative," rather than "ideal." The terms "comprise," "include," "have," "with," and any variations thereof are used synonymously to denote or describe a non-exclusive inclusion. As such, a device or a method that uses such terms does not include only those elements or steps, but may include other elements and steps not expressly listed or inherent to such device and method. Further, the terms "first," "second," and the like, herein do not denote any order, quantity, or importance, but rather are used to distinguish one element from another. Similarly, terms of relative orientation, such as "top," "bottom," etc. are used with reference to the orientation of the structure illustrated in the figures being described. Moreover, the terms "a" and "an" herein do not denote a limitation of quantity, but rather denote the presence of at least one of the referenced item.

In this disclosure, the term "region" is used generally to refer to one or more layers. That is, a region (as used herein) may include a single layer (deposit, film, coating, etc.) of material or multiple layers of materials stacked one on top of another (i.e., a multi-layer structure). Further, although in the description below, the different regions and/or layers in the disclosed magnetoresistive stacks are referred to by specific names (e.g., capping region, reference region, transition region, etc.), this is only for ease of description and not intended as a functional description of the layer. Moreover, although the description below and the figures appear to depict a certain orientation of the layers relative to each other, those of ordinary skill in the art will understand that such descriptions and depictions are only exemplary. For example, though the "free" region is depicted as being "above" an intermediate region, in some aspects the entire magnetoresistive stack may be flipped such that the intermediate region is "above" the "free" region.

In one exemplary aspect, a magnetoresistive device of the present disclosure may be implemented as a spin-torque magnetoresistive random access memory ("MRAM") element ("memory element"). In such aspects, the magnetoresistive bits of the device may include an intermediate region positioned (or sandwiched) between two ferromagnetic regions to form a magnetic tunnel junction (MTJ) device or an MTJ-type device. In such a device, the intermediate region may be a tunnel barrier and include an insulating material, such as, e.g., a dielectric material. In this disclosure, the magnetoresistive bits of an MTJ device are referred to as MTJ bits. In other embodiments, the intermediate region may be a conductive material, e.g., copper, gold, or alloys thereof. In these other embodiments, where the magnetoresistive bits include a conductive material in between two ferromagnetic regions, the magnetoresistive device may form a giant magnetoresistance (GMR) or GMR-type device. Although aspects of the current disclosure are described below with reference to an MTJ device (having MTJ bits), this is not a limitation. In general, aspects of the current disclosure are generally applicable to any type of magnetoresistive device.

In an exemplary MTJ bit, of the two ferromagnetic regions disposed on either side of the intermediate region, one ferromagnetic region may be a magnetically "fixed" (or pinned) region, and the other ferromagnetic region may be a magnetically "free" region. The term "free" is intended to refer to ferromagnetic regions having a magnetic moment that may shift or move significantly in response to applied magnetic fields or spin-polarized currents used to switch the magnetic moment vector. On the other hand, the words "fixed" and "pinned" are used to refer to ferromagnetic regions having a magnetic moment vector that does not move substantially in response to such applied magnetic fields or spin-polarized currents. As is known in the art, an electrical resistance of an MTJ bit may change based on whether the magnetization direction (e.g., the direction of the magnetic moment) of the "free" region adjacent to the non-magnetic layer is in a parallel alignment (P) or in an antiparallel (AP) alignment with the magnetization direction (e.g., the direction of the magnetic moment) of the "fixed" region adjacent to the non-magnetic layer. Typically, if the two regions have the same magnetization alignment (i.e., parallel or P alignment), the MTJ bit has a relatively low(er) electrical resistance ($R_{Min}$). This relatively lower resistance may be considered as a digital "0." In contrast, if the alignment is antiparallel (AP), the MTJ bit has a relatively high(er) electrical resistance ($R_{Max}$), which may be considered to be a digital "1."

Switching the magnetization direction of the "free" region of an MTJ bit may be accomplished by driving a tunneling current pulse through the MTJ bit. The polarity of the current pulse determines the final magnetization state (i.e., P or AP) of the "free" region. For example, directing tunneling current of sufficient magnitude in one direction (e.g., from the "fixed" region towards the "free" region) may change the magnetization state of the "free" region to be antiparallel (i.e., AP) with the magnetization state of the "fixed" region. And, directing the tunneling current in the opposite direction (e.g., from the "free" region towards the "fixed" region) may change the magnetization state of the "free" region to be parallel (i.e., P) with the magnetization state of the "fixed" region. The mean current required to switch the magnetic state of the "free" region may be referred to as the critical current (Ic). The critical current is indicative of the current required to switch the magnetization state of the MTJ bit (from P to AP or vice versa), or to "write" data in, the MTJ bit. Typically, to write data, a tunneling current ($I_W$) having a magnitude greater than (or equal to) Ic is directed through the MTJ bit to change the MTJ bit from P to AP (or AP to P based on the polarity of the current).

In an exemplary MTJ device, the MTJ bits may be formed between a top electrode/via/line and a bottom electrode/via/line and, which permit access to the bit by allowing for electrical connectivity to circuitry and other elements of the magnetoresistive device (e.g., access transistors, bit line, word line, logic circuitry, etc.). Between the electrodes/vias/lines are multiple regions, including at least one "fixed" magnetic region (referred to hereinafter as a fixed region) and at least one "free" magnetic region (referred to hereinafter as a free region) with one or more intermediate region(s), such as, e.g., a dielectric layer (that form(s) a tunnel barrier) between the fixed and the free regions. Each of the fixed and the free regions may include, among other things, a plurality of ferromagnetic layers. In some embodiments, the top electrode may be eliminated, and a bit line (or an interconnect in electrical contact with the bit line) may be formed on top of the stack. Similarly, in some embodiments, the bottom electrode may be eliminated and the MTJ bit may be formed directly on a word line (or an interconnect structure in electrical contact with the word line) of the device.

FIG. 1 is a cross-sectional view of a portion of an MTJ device 1000 of the current disclosure with an exemplary MTJ bit 100. MTJ bit 100 may be coupled or otherwise connected to an access transistor T and to various conductors (e.g., source line conductor, word line conductor, bit line conductor, etc.) which may carry control signals and provide access to MTJ bit 100 (e.g., to read and write MTJ bit 100). MTJ device 1000 may be used in any suitable application, including, for example, in a memory configuration. MTJ bit 100 may be formed from a magnetoresistive stack 90 that includes multiple regions deposited (or otherwise formed) one above the other. As illustrated in FIG. 1, the multiple regions that form MTJ bit 100 includes an intermediate region 30 positioned between a fixed region 20 and a free region 40. As explained previously, in a magnetic tunnel junction (MTJ) device, intermediate region 30 includes a dielectric material and functions as a tunnel barrier. Although not a requirement, in some embodiments, MTJ bit 100 may be formed between a first electrode 10 (e.g., a bottom electrode) and a second electrode 50 (e.g., a top electrode). First and second electrodes 10, 50 may comprise an electrically conductive material, and may be part of (or be in physical contact with) electrically conductive interconnects (e.g., vias, traces, lines, etc.) of MTJ device 1000. In some embodiments, first and/or second electrodes 10, 50 may be eliminated, and MTJ bit 100 may be in direct contact with a metallization structure (e.g., line, via, etc.) of MTJ device 1000.

In some embodiments, a metal such as tantalum (Ta), titanium (Ti), tungsten (W), or a composite or alloy of these elements (e.g., tantalum-nitride alloy) may be used for first and second electrodes 10, 50. Fixed and free regions 20, 40 may include any ferromagnetic alloy (such as, for example, alloys that include some or all of cobalt (Co) and iron (Fe), boron (B), etc.). In some embodiments, fixed region 20 may have a fixed, unpinned synthetic antiferromagnetic (SAF) or a synthetic ferromagnetic (SyF) structure. Since SAFs and SyFs are known to those skilled in the art, they are not described herein. Intermediate region 30 may function as a tunnel barrier of MTJ bit 100, and in some embodiments, include an oxide material, such as, for example, Magnesium Oxide ($MgO_x$) or Aluminum Oxide ($AlO_x$ (e.g., $Al_2O_3$)). It should be noted that the configuration (stack/structure, number and order of regions, etc.) of MTJ bit 100 illustrated in FIG. 1 is only exemplary, and any currently known of later developed MTJ bit may be used in MTJ device 1000. U.S. Pat. Nos. 8,686,484; 8,747,680; 9,023,216; 9,136,464; and 9,419,208; U.S. Patent Application Publication No. 2018/0158498; U.S. Patent Application Nos. 62/591,945 (filed Nov. 29, 2017); 62/594,229 (filed Dec. 4, 2017); 62/580,612 (filed Nov. 2, 2017); 62/582,502 (filed Nov. 7, 2017); and 62/588,158 (filed Nov. 17, 2017) describe exemplary MTJ bits that may also be used in MTJ device 1000 of FIG. 1. These references are incorporated by reference in their entirety herein.

In MTJ device 1000, MTJ bits 100 are arranged side by side in a plane (e.g., with reference to FIG. 1, in the XY plane) so as to form a two-dimensional array of MTJ bits 100. FIG. 2 is a schematic illustration of a top view of MTJ device 1000 with an array of MTJ bits 100 arranged in the XY plane at a pitch D. For improved performance (e.g., increasing memory storage in a smaller area, etc.) of MTJ device 1000, it is desirable to increase the density of MTJ bits 100 in device 1000. The density of MTJ bits 100 may be increased by positioning adjacent MTJ bits 100 closer together (i.e., decreasing the pitch D). However, as would be recognized by people of ordinary skill in the art, manufacturability issues (and other practical limitations) limit the minimum pitch D of MTJ bits 100 in device 1000. For example, some line-of sight manufacturing processes, such as, for example, ion beam etch (IBE), reactive ion etching (ME), sputter deposition, etc., have better yield when the pitch D or the spacing between the MTJ bits 100 increase.

FIG. 3 illustrates the effect of the spacing between adjacent MTJ bits 100 in an array during fabrication. FIG. 3 depicts two adjacent MTJ bits 100, each having a height $\beta$, spaced apart by a distance $\alpha$ (where $\alpha$=pitch D−MTJ diameter d) being subjected to an exemplary fabrication process, for example, IBE. As would be recognized by a person of ordinary skill in the art, IBE is an etching processes that may be used to etch the multiple regions (e.g., 50, 40, 30, etc.) of an MTJ stack to form MTJ bits 100 and/or for cleaning the side walls of the etched MTJ bits. As schematically illustrated in FIG. 3, during IBE, charged ions from a source impact and abrade regions during etching and cleaning. It is known that, during some IBE processes (e.g., IBE etch clean), a shallower angle $\theta$ (see FIG. 3) may result in better results. For example, when IBE is used to clean the side walls of the MTJ bits 100, a smaller angle $\theta$ may result in better cleaning of the side walls. As evident from FIG. 3, for a fixed bit height $\beta$, as the bit spacing $\alpha$ increases, the ion beam angle $\theta$ can be decreased. Based on geometry of the MTJ bit array, the relationship between angle $\theta$, spacing $\alpha$, and bit height $\beta$ is, $\theta=\tan^{-1}(\beta/\alpha)$. It is known that, when the ion beam angle $\theta$ decreases, or when spacing $\alpha$ increases (i.e., ratio $\alpha/\beta$ increases), the number of defective MTJ bits in an MTJ device decreases. Thus, for improved manufacturability (e.g., reduce the number of defective MTJ bits in MTJ device 1000), it is desirable to increase the bit-bit spacing $\alpha$. In contrast, for improved performance (e.g., increase in memory density of MTJ device 1000), it is desirable to decrease the bit-bit spacing $\alpha$. Typically, to reduce manufacturing related defects in MTJ device 1000, the minimum allowable spacing $\alpha_{min}$ between the MTJ bits is kept greater than or equal to ($\geq$) a preselected value.

If all the MTJ bits 100 in a device 1000 are positioned on the same plane (e.g., the same XY plane), the pitch D between adjacent MTJ bits 100 should be such that the spacing $\alpha$ between the MTJ bits is $\geq$ the minimum allowable spacing $\alpha_{min}$. With reference to MTJ device 1000 of FIG. 2, if the minimum allowable spacing $\alpha_{min}$ for the manufacturing technology is, for example, 54 nm, the spacing $\alpha$ between MTJ bits 100 is typically selected to be $\geq$54 nm so that suitable MTJ bits can be repeatably fabricated. If the diameter d of the MTJ bits 100 is 30 nm, the pitch D of MTJ bits 100 will be 84 nm (54+2*30/2). In such an embodiment, the bit cell size A of MTJ device 1000 may be 84×84 nm². Therefore, when the minimum allowable spacing $\alpha_{min}$ between MTJ bits 100 is 54 nm, the minimum bit cell size A will be 84×84 nm². As would be recognized by people of ordinary skill in the art, decreasing the bit cell size of MTJ device 1000 may allow the same amount of data to be saved in a smaller area, and thus, increase memory density. Some below described embodiments of the current disclosure may allow the memory density of MTJ device 1000 to be increased while maintaining the minimum allowed bit-bit spacing $\alpha_{min}$.

FIGS. 4A and 4B are schematic illustrations of another embodiment of an MTJ device 1000A of the current disclosure. FIG. 4A illustrates the top view of MTJ device 1000A showing a plurality of MTJ bits (100A, 100B) arranged in different XY planes. And, FIG. 4B is a cross-sectional illustration of MTJ device 1000A along the XZ plane (indicated in FIG. 4A) showing the arrangement of MTJ bits 100A, 100B in the XZ plane. As can be seen in FIG. 4B, MTJ device 1000A includes a first array of MTJ devices 100A positioned in a first XY plane ($XY_1$ plane) and a second array of MTJ devices 100B positioned in a second XY plane ($XY_2$ plane), spaced apart from the $XY_1$ plane in the Z direction. That is, MTJ device 1000A includes two arrays of MTJ bits spaced apart from each other in the Z, or vertical, direction. Note that, in FIG. 4A, MTJ bits 100A in the $XY_1$ plane are shown using solid lines and MTJ bits 100B in the $XY_2$ plane are shown using dashed lines. Although not a requirement, in some embodiments, as schematically illustrated in FIG. 4A, MTJ bits 100A and 100B may have a substantially circular cross-sectional shape (in the XY plane). In some embodiments, MTJ bits 100A, 100B may have a substantially cylindrical or frustoconical 3-dimensional shape (see FIG. 3) with a wider bottom end and a narrower top end. It should be noted that the illustrated frustoconical shape of the MTJ bits (in FIG. 3) is not a requirement but is the result of etching and/or other manufacturing processes used to form MTJ bits 100A and 100B from a magnetoresistive stack (e.g., magnetoresistive stack 90 of FIG. 1).

Assuming that the minimum allowed bit-bit spacing $\alpha_{min}$ is 54 nm, in some embodiments, the spacing $\alpha$ between the closest adjacent MTJ bits 100A (and between MTJ bits 100B) on the same plane may be 54 nm for fabrication. For MTJ bits 100A in the $XY_1$ plane and MTJ bits 100B in the $XY_2$ plane, the tightest bit-bit distance (or pitch) is the angled dimension marked D in FIG. 4A. Note that, based on geometry, D is related to distance "a" as, $D=\sqrt{(2a^2)}$. If the tightest bit-bit spacing $\alpha$ between the MTJ bits is 54 nm, and the size (i.e., diameter d) of each MTJ bit (100A and 100B) is 30 nm, the pitch D between the MTJ bits in each plane will be 84 nm (i.e., 54+2*30/2). Thus, similar to MTJ device 1000 of FIG. 2, the bit cell size A in each individual XY plane of MTJ device 1000A will be 84×84 nm². Based on geometry, the distance "a" between adjacent MTJ bit 100A in the $XY_1$ plane along the X and Y axes, and the closest adjacently positioned MTJ bit 100B in the $XY_2$ plane (along the X and Y axes) will be about 60 nm (i.e., $a=\sqrt{(84^2/2)}$). Therefore, as illustrated in FIG. 4A, the effective bit cell size A' of MTJ device 1000A is "a"×"a" or about 60×60 nm². Thus, arranging the MTJ bits in two vertically spaced apart planes (e.g., as shown in FIGS. 4A and 4B) reduces the bit cell size from 84×84 nm² to about 60×60 nm². This reduction in bit cell size reduces the cell area by about 49% (i.e., from 7056 nm² to 3600 nm²) and almost doubles the memory density (memory/area).

MTJ bits 100A and 100B may have the same configuration (stack/structure, number and order of regions, etc.) and/or size or may have different configurations and/or sizes. For example, in some embodiments, MTJ bit 100A in the $XY_1$ plane may have a configuration similar to the configuration of MTJ bit 100 illustrated in FIG. 1 and MTJ bit 100B in the $XY_2$ plane may have a different configuration (e.g., a configuration described in a patent or patent application incorporated by reference herein). In some embodiments, one of MTJ bits 100A (in the $XY_1$ plane) or MTJ bits 100B (in the $XY_2$ plane) may be high $E_b$ (and high $V_c$) MTJ bits and the other MTJ bit low $E_b$ (and low $V_c$) MTJ bits, which would allow for the MTJ device to survive DR in extreme conditions and then revert to a low Vc, high endurance mode most of the time. For example, MTJ bits 100B may be created as higher $E_b$ bits by having different magnetic properties for the 2nd layer (or vice versa) such as by a different magnetic thickness. Typically, the dimensions and/or configurations of MTJ bits 100A and 100B may be selected based on the desired characteristics of the MTJ device produced therefrom. In some embodiments of the current disclosure, the size of an MTJ bit may be increased while maintaining the bit-bit spacing α at the minimum allowable value $α_{min}$ (e.g., 54 nm in the exemplary embodiments discussed above). For example, in some embodiments, the size of the MTJ bits (100A and/or 100B) in one or both of the $XY_1$ and $XY_2$ planes may be increased while maintaining the pitch D (of the MTJ bits in each XZ plane) at 84 nm and/or the bit-bit spacing α at 54 nm. As would be recognized by a people of ordinary skill in the art, increasing the area of an MTJ bit improves its electrical characteristics (e.g., reduce % sigma and increase energy barrier, $E_b$). As would be recognized by a person of ordinary skill in the art, increasing the size of an MTJ bit reduces percent sigma, which is a figure of merit for read performance of an MTJ bit. For example, if absolute sigma is fixed, then percent sigma will be reduced in proportion to 1/area. Energy barrier, $E_b$, is related to data retention. As would be recognized by a person of ordinary skill in the art, $E_b$ scales with magnetic volume. Given a fixed magnetic thickness, $E_b$ scales with bit area.

FIG. 5 illustrates an exemplary MTJ device 1000B of the current disclosure where the MTJ bits of one array (e.g., MTJ bits 100B' in the $XY_2$ plane) have a substantially square (or diamond) shape and MTJ bits 100A in the $XY_1$ plane have a substantially circular shape (similar to MTJ bits 100A of FIG. 4A). In FIG. 5, the outline of the substantially circular MTJ bits 100A (in the $XY_1$ plane) are also shown within the substantially square MTJ bits 100B' in the $XY_2$ plane merely to illustrate the relative size (and shape) of MTJ bit 100B' as compared to MTJ bit 100A. As illustrated in FIG. 5, MTJ bits 100B' may be sized and shaped such that the substantially circular MTJ bits 100A form inscribed circles within the substantially square MTJ bits 100B'. When in this configuration, the area of the substantially square MTJ bits 100B' is greater by about 27% than the area of the substantially circular MTJ bits 100A (e.g., from $π×30^2/4$ to $30^2$). It should be noted that, the illustrated shape of MTJ bit 100B' (e.g., a square shape with straight edges and sharp corners, etc.) in FIG. 5 is only exemplary. As would be recognized by a person or ordinary skill in the art, after manufacturing, the edges and corners of the MTJ bits 100B' may be irregular (e.g., corners may be rounded, edges may be curved, etc.). However, even with rounded corners, etc., MTJ bit 100B' will have a greater area than MTJ bit 100A. In some embodiments, MTJ bits 100B' may have a different shape (substantially rectangular, etc.). As can be seen in FIG. 5, the substantially square MTJ bits 100B' are oriented such that the spacing α between the adjacent MTJ bits 100B' is the same as the spacing α between MTJ bits 100A (e.g., same as the spacing α between MTJ bits 100B of FIG. 4A). For example, the substantially square shaped MTJ bits 100B' may be oriented such that the side surfaces of the closest adjacent MTJ bits 100B' face each other to maximize the spacing α between these MTJ bits 100B'. Thus, in some embodiments, MTJ bits in each layer of an MTJ device may be configured (e.g., shaped, oriented, etc.) to maximize their area (for improved electrical/magnetic performance) while also maximizing the space between the MTJ bits (for ease of manufacturing).

The substantially circular MTJ bits 100A and the substantially square MTJ bits 100B' may be formed by any now-known or future-developed method. In some embodiments, known IC fabrication techniques, such as, for example, double patterning may be used to create square or diamond shaped MTJ bits, and single patterning may be used to create circular MTJ bits. In some embodiments, after depositing (or otherwise forming) blanket layers that form the different regions of a magnetoresistive stack (e.g., regions 10-50 of magnetoresistive stack 90 of FIG. 1), a patterned mask (having covered and exposed areas) may be formed on the exposed surface of the deposited regions using conventional photolithographic techniques. The different regions of the stack may then be etched (using IBE, RIE, etc.), in one or multiple etching steps, through the exposed regions of the mask to form an array of MTJ bits separated by spaces. In some embodiments, the covered areas of the mask may correspond to the desired shape (circular, square, rectangular, etc.) of the MTJ bits. Since photolithographic techniques that may be used to form an MTJ bit from an a magnetoresistive stack are known in the art, they are not described in detail herein.

Although not a requirement, in some embodiments, a substantially circular MTJ bit (e.g., MTJ bit 100A of FIG. 5) may be formed using a single photolithography step followed by one or more etching (litho-etch) steps. For example, a photoresist may be first coated on the exposed surface of the magnetoresistsive stack (e.g., of FIG. 1) and developed. After developing, the photoresist (e.g., hardened photoresist) will form a pattern of circular islands spaced apart from each other. One or more etching steps (IBE, RIE, etc.) may then be performed to etch away the materials (of regions 10-50 of FIG. 1) from areas that are not covered by the photoresist to leave behind an array of substantially circular MTJ bits 100A. In some embodiments, a single etching step may be used to etch through all the regions of the magnetoresistive stack (in areas not covered by the photoresist). In some embodiments, multiple etching steps may be used to etch the different regions. For example, a first etching step may be used to etch a region of the magnetoresistive stack (hard mask region) on the surface. Some or all of the photoresist may also be removed during this etching step. The newly exposed region of the stack under the etched photoresist may then be used as a hard mask to etch the region below.

A substantially square shaped MTJ bit (e.g., MTJ bit 100B' of FIG. 5) or a substantially circular shaped MTJ bit (e.g., MTJ bit 100A of FIG. 5) may be formed using variations of the process described above. In some embodiments, a substantially square shaped MTJ bit may be formed using a photolithographic process with multiple litho-etch steps. For example, in a first litho-step, the photoresist deposited on the magnetoresistive stack (of FIG. 1) may be developed to form a first mask in the form of a series of spaced-apart parallel strips extending in one direction. That is, hardened photoresist may form multiple spaced apart parallel strips on the surface of the magnetoresistive stack. The exposed areas (of the magnetoresistive stack) between these parallel strips may then be etched (in one or multiple etching steps) to leave behind magnetoresistive stack in the form of a series of spaced-apart parallel strips covered by the photoresist. A second litho-etch step may then be performed by depositing and patterning a second mask to expose a series of spaced-apart parallel strips extending in the opposite direction (i.e., in a direction perpendicular to the direction of the first etching step described above). After this second litho step, square shaped (or rectangular shaped) areas of the stack that were previously covered by the first mask (during the first litho-etch step) will be exposed. These newly exposed regions of the magnetoresistive stack are then etched to leave behind an array of substantially square shaped MTJ bits 100B'. It should be noted that the above described processes are merely exemplary and any now-known or future developed processed may be used to form MTJ bits of the desired shape (circular, square, rectangular, or another shape). Some suitable litho-etch processes that may be used to form the MTJ bits are described in U.S. Patent Application Publication No. 2019/0067566, which is incorporated by reference in its entirety herein. In some embodiments, as explained in the '400 application, a multi-litho-etch process may result in tighter control of the pitch between MTJ bits.

Although only the array of MTJ bits (e.g., MTJ bits 100B' in the $XY_2$ plane) are illustrated as having a substantially square shape in FIG. 5, this is only exemplary. In some embodiments, both arrays of MTJ bits (i.e., MTJ bits 100A' in the $XY_1$ plane and MTJ bits 100B' in the $XY_2$ plane) may include substantially square shaped MTJ bits that are configured (e.g., shaped, oriented, etc.) to maximize their area while also maximizing the space between the MTJ bits. It should be noted that although the alternate shape of the MTJ bits are described as being substantially square or diamond shaped, this is only exemplary. In general, any suitable shape (e.g., rectangular, polygonal, hexagonal, octagonal, etc.) that increases the area of the MTJ bits (as compared to a conventional substantially circular MTJ bit) while also increasing or maintaining the spacing between the MTJ bits may be used.

As alluded to above, the MTJ devices of the current disclosure may be implemented in a sensor architecture or a memory architecture (among other architectures). For example, in a memory configuration, the above described MTJ cells with multiple stacked MTJ bits may be electrically connected to an access transistor and configured to couple or connect to various conductors, which may carry one or more control signals, as shown in FIG. 6. The MTJ devices of the current disclosure may be used in any suitable application, including, e.g., in a memory configuration. In such instances, the described MTJ devices may be formed as an integrated circuit comprising a discrete memory device (e.g., as shown in FIG. 7A) or an embedded memory device having a logic therein (e.g., as shown in FIG. 7B), each including MRAM, which, in one embodiment is representative of one or more arrays of MRAM having a plurality of MTJ cells, according to certain aspects of certain embodiments disclosed herein.

Exemplary methods of fabricating an exemplary MTJ device (e.g., MTJ device 1000A) will now be described. It should be appreciated that the described methods are merely exemplary. For the sake of brevity, conventional techniques related to semiconductor processing may not be described in detail. The exemplary embodiments may be fabricated using known lithographic processes. The fabrication of integrated circuits, microelectronic devices, micro electro mechanical devices, microfluidic devices, and photonic devices involves the creation of several layers or regions (i.e., comprising one or more layers) of materials that interact in some fashion. One or more of these regions may be patterned so various regions of the layer have different electrical or other characteristics, which may be interconnected within the region or to other regions to create electrical components and circuits. These regions may be created by selectively introducing or removing various materials. The patterns that define such regions are often created by lithographic processes. For example, a layer of photoresist is applied onto a layer overlying a wafer substrate. A photo mask (containing clear and opaque areas) is used to selectively expose the photoresist by a form of radiation, such as ultraviolet light, electrons, or x-rays. Either the photoresist exposed to the radiation, or not exposed to the radiation, is removed by the application of a developer. An etch may then be employed/applied whereby the layer (or material) not protected by the remaining resist is patterned. Alternatively, an additive process can be used in which a structure is built up using the photoresist as a template.

In some embodiments, the disclosed methods may include a number of additional or alternative steps, and in some embodiments, one or more of the described steps may be omitted. Any described step may be omitted or modified, or other steps added, as long as the intended functionality of the fabricated device remains substantially unaltered. Further, although a certain order is described or implied in the described methods, in general, the steps of the described methods need not be performed in the illustrated and described order. Further, the described methods may be incorporated into a more comprehensive procedure or process having additional functionality not described herein.

FIGS. 8A-8G are schematic illustrations of a partially formed MTJ device 1000A' at different stages during the fabrication of an exemplary MTJ device (e.g., MTJ device 1000A of FIGS. 4A and 4B). And, FIG. 9 is a flow chart of an exemplary method 300 of fabricating MTJ device 1000A. In the discussion below, reference will be made to both FIGS. 8A-8G and FIG. 9. After a semiconductor substrate 200 having integrated circuit devices (such as, for example, transistors) is processed using conventional IC fabrication techniques, electrical contacts or electrically conductive vias 220 are formed on substrate 200 (step 310). FIG. 8A is a schematic illustration of substrate 200 with vias 220 formed thereon. In general, as illustrated in FIG. 8A, vias 220 may be positioned to be in electrical contact with landing pads 210 on substrate 200. A landing pad 210 is a metallization pattern (trace, etc.) made of a conductive material that is in electrical contact with one or more transistors or circuit devices formed on substrate 200. Vias 220 may include any electrically conductive material and may be formed by any now-known or later-developed material deposition processes (such as, for example, sputtering, physical vapor deposition, chemical vapor deposition, selective ALD, etc.). In some embodiments, vias 220 may include copper, tantalum, titanium, tungsten, or another advanced integration material (such as, for example, Cobalt (Co), Ruthenium (Ru), etc.). In some embodiments, a material with good sputter (or selective ALD) deposition or redeposition characteristics may be used to form vias 220. Materials with good redeposition characteristics includes materials that does not re-sputter up on to the bits. These materials include materials with relatively low Youngs modulus, or "softer materials," such as, for example, copper. Vias 220 may provide electrical connectivity to transistors and/or other integrated circuit devices of substrate 200 via landing pads 210.

As illustrated in FIG. 8A, a dielectric material or an encapsulant 230 may also be provided around vias 220. Encapsulant 230 may be an inter-layer dielectric (ILD) material used in integrated circuit (IC) applications. Conventional ILD materials include materials such as, for example, silicon nitride (e.g., $Si_3N_4$, SiN, etc.), silicon oxide (e.g., $SiO_2$, $SiO_x$, etc.), TEOS (Tetraethyl Orthosilicate), etc. These ILD materials typically have a relatively high dielectric constant. As integrated circuit (IC) devices scale smaller (e.g., transistors get closer together and spacing between interconnects in the circuit decrease), the associated higher resistance and capacitive coupling may cause signal delay, known as RC delay, in the circuit. Lowering the dielectric constant, or the "k" value, of the ILD decreases the RC delay, lowers power consumption, and reduces "cross-talk" between nearby interconnects. There are many known low-k (or ultra low-k) materials that may be used as the ILD in IC devices. See, for example, "Materials chemistry for low-k materials," Materials Today, Volume 9, Issue 3, March 2006, Pages 22-31, which is incorporated by reference in its entirety herein. There is also a significant amount of ongoing research to determine suitable low-k and ultra low-k ILD materials for IC applications. Encapsulant 230 may include any now-known (flourine-doped silicon dioxide or silicas, carbon-doped silicon dioxide or silicas (e.g., SiCOH), porous silicon dioxide, spin-on organic polymeric dielectrics, spin-on silicon based polymeric dielectric SiCOH, etc.) or later-developed ILD material.

Any suitable process (e.g., chemical vapor deposition (CVD), atomic layer deposition (ALD), etc.) may be used to deposit encapsulant 230. In some embodiments, encapsulant 230 may be initially deposited as a conductor (for example, an oxidizable or nitridizable metal such as aluminum or magnesium), and thereafter oxidized or nitridized to change or transform at least a portion of the deposited material to an insulating material. Although not a requirement, in some embodiments, to form vias 220 (i.e., step 310), a layer of encapsulant 230 may first be deposited on substrate 200 over landing pads 210, for example, as a blanket layer. Cavities corresponding to the location of vias 220 may then be formed through the deposited encapsulant 230 using conventional photolithographic and etching techniques. An electrically conductive material may then be deposited in the cavities to form electrically conductive vias 220. It should be noted that, the above-described process flow is merely exemplary and is not a requirement. As would be recognized by a person or ordinary skill in the art, conductive vias 220 may also be formed using other methods.

When MTJ device 1000A of FIG. 4A is being fabricated, the arrangement or pattern of vias 220 formed on substrate 200 may correspond with the pattern of MTJ bits 100A and 100B illustrated in FIG. 4A. That is, with reference to FIGS. 4A and 8A, the pitch of vias 220 along the X and Y axes will be "a." With reference to FIGS. 4B and 8B, MTJ bits 100A may then be formed over every alternate via 220 along the Y-axis and the X-axis (step 320). These formed MTJ bits 100A correspond to the array of MTJ bits on the $XY_1$ plane of MTJ device 1000A (see FIG. 4A). MTJ bits 100A may be formed directly on, or formed in electrical contact with, vias 220. Forming MTJ bits 100A may include depositing (e.g., sequentially depositing) the different regions (e.g., regions 10-50 of FIG. 1) that comprise MTJ bit 100A. For example, in embodiments, where MTJ bit 100A has the configuration of MTJ bit 100 illustrated in FIG. 1, forming MTJ bit 100A may include sequentially depositing (by any known material deposition processes, such as, for example, sputtering, physical vapor deposition, chemical vapor deposition, etc.) the materials that form first electrode 10, fixed region 20, intermediate region 30, free region 40, and second electrode 50 one on top of another. After sequentially depositing these multiple regions (e.g., to form magnetoresistive stack 90 of FIG. 1), forming MTJ bits 100A (i.e., step 320) may include other known processes, such as, for example, etching, photolithography, etc.).

After MTJ bits 100A are formed on every alternate via 220 (along the Y-axis and the X-axis), as illustrated in FIG. 8B, an encapsulant 230' may be deposited over the MTJ bits 100A. Encapsulant 230' may include any one of the materials described previously with reference to encapsulant 230. Although not a requirement, in some embodiments, encapsulant 230' may include the same material as encapsulant 230. Any suitable now-known of later-developed process may be used to deposit encapsulant 230'. Vias 220' may then be formed through encapsulant 230' to contact each via 220 or MTJ bit 100A (step 330). For example, in some embodiments, cavities (e.g., having the same arrangement in the XY plane as MTJ bits 100A and 100B of FIG. 4B) may first be etched through the deposited encapsulant 230' to expose a top surface of MTJ bits 100A or vias 220, and the etched cavities filled with an electrically conductive material to form electrically conductive vias 220'. In general, via 220' may include a material described with reference to via 220. Although not a requirement, in some embodiments, vias 220 and 220' may include the same material.

FIG. 8C is a schematic illustration of a partially formed MTJ device 1000A' with vias 220' contacting the top surfaces of vias 220 and MTJ bits 100A. With reference to vias 220, 220' that contact MTJ bits 100A, vias 220 may contact the first electrode 10 (see FIG. 1) and vias 220' may contact the second electrode 50 of MTJ bit 100A. As illustrated in FIG. 8C, when encapsulant 230' is deposited over MTJ bits 100A, due to the thickness of MTJ bits 100A, the deposited encapsulant 230' may form mounds or hillocks in areas over the MTJ bits. In some embodiments, a polishing step (e.g., a chemical mechanical polishing (CMP) step) may be carried out to planarize the top surface of the deposited encapsulant 230' before forming vias 220' therethrough. In some embodiments, this interim polishing step (e.g., before forming vias 220') may be eliminated, and a polishing step (e.g., CMP) may be implemented after forming the vias 220'. FIG. 8D is a schematic illustration of the partially formed MTJ device 1000A' of FIG. 8C after polishing the top surface of the encapsulant 230' and vias 220'.

MTJ bits 100B may now be formed over every via 220' that is formed directly on via 220 (i.e., vias 220' not connected to via 220 through an MTJ bit 100A) (step 340). FIG. 8E is a schematic illustration of the partial MTJ device 1000A' of FIG. 8D with MTJ bits 100B. As illustrated in FIG. 8E, MTJ bits 100B are formed on alternate vias 220' along the Y-axis and the X-axis. These MTJ bits 100B correspond to the array of MTJ bits on the $XY_2$ plane of MTJ device 1000A of FIG. 4A. MTJ bits 100A may be formed directly on, or formed in electrical contact with, vias 220'. MTJ bits 100B may be formed in a similar manner as MTJ bits 100A in the $XZ_1$ plane (described with reference to FIG. 8B). That is, MTJ bits 100B may be formed by sequentially depositing the different regions that comprise MTJ bit 100B and processing (e.g., etching, etc.) the deposited regions to form MTJ bit 100B. MTJ bits 100B may be similar in configuration (e.g., in structure, shape, size, etc.) to, or different from, MTJ bits 100A. For example, in some embodiments, as described with reference to FIG. 5, MTJ bits 100A may have a substantially circular shape and MTJ bits 100B may have a substantially square shape. In general, the configuration of MTJ bit 100A and 100B may be selected based on the desired characteristics of the MTJ device.

After MTJ bits 100B are formed on every alternate via 220', an encapsulant 230" may be deposited over the MTJ bits 100B. FIG. 8F is a schematic illustration of the partial MTJ device 1000A' of FIG. 2E with encapsulant 230" deposited thereon. Encapsulant 230" may include one of the materials described previously with reference to encapsulant 230. Although not a requirement, in some embodiments, encapsulant 230" may include the same material as encapsulant 230' and/or encapsulant 230. Vias 220" may then be formed through the deposited encapsulant 230' 'to contact the top surface of MTJ bits 100B or the top surface of vias 220' (step 350). For example, as described with reference to FIG. 8C, cavities (e.g., having the same arrangement in the XY plane as MTJ bits 100A and 100B of FIG. 4B) may first be etched through the deposited encapsulant 230" to expose the top surface of MTJ bits 100B or vias 220', and the etched cavities filled with an electrically conductive material to form electrically conductive vias 220". Via 220" may include a material described with reference to via 220. Although not a requirement, in some embodiments, vias 220, 220', and 220" may include the same material.

As illustrated in FIG. 8F, encapsulant 230" may form hillocks in areas over the MTJ bits 100B. In some embodiments, CMP (or another polishing step) may be performed to planarize the surface of the deposited encapsulant 230" before forming vias 220" therethrough. In some embodiments, polishing may not be performed before forming vias 220'. Instead, as illustrated in FIG. 8G, polishing (e.g., CMP) may be performed after forming the vias 220" to planarize the top surface of the encapsulant 230" and vias 220" for subsequent fabrication steps. After MTJ bits 100A and 100B are formed as described above, additional processing steps (such as, for example, forming a bit contact structure on the exposed regions of vias 220" on the top surface) may be performed to fabricate an MTJ device 1000A from MTJ bits 10A and 100B (step 360). Since these additional processing steps are known to those of ordinary skill in the art, they are not described herein for the sake of brevity.

It should be noted that the fabrication steps described above are only exemplary. Any suitable method may be used to form MTJ device 1000A with vertically spaced apart arrays of MTJ bits 100A, 100B. Since suitable integrated circuit fabrication techniques (e.g., deposition, sputtering, evaporation, plating, oxidizing, etc.) that may be used in the fabrication steps described above are known to those of ordinary skill in the art, they are not described here in greater detail. In some embodiments, forming some regions of MTJ device 1000A may involve thin-film deposition processes, including, but not limited to, physical vapor deposition techniques such as ion beam sputtering and magnetron sputtering. And, forming thin insulating layers (e.g., intermediate regions of the MTJ bits) may involve physical vapor deposition from an oxide target, such as by radio-frequency (RF) sputtering, or by deposition of a thin metallic film followed by an oxidation step, such as oxygen plasma oxidation, oxygen radical oxidation, or natural oxidation by exposure to a low-pressure oxygen environment.

In some embodiments, one or more of the magnetic regions of MTJ bits 100A, 100B (e.g., fixed and/or free regions) may be deposited using a "heavy" inert gas (for example, xenon (Xe)), for example, at room temperature (for example, 15-40° C., and more preferably 20-30° C., and most preferably 25° C. (+/−10%)) or a conventional/typical elevated temperature. In some embodiments, formation of some or all of the regions of the MTJ device may also involve other known processing steps such as, for example, selective deposition, photolithography processing, etching, etc., in accordance with any of the various conventional techniques known in the semiconductor industry. In some embodiments, during deposition of the fixed and free regions of the first and second MTJ bits, a magnetic field may be provided to set a preferred easy magnetic axis of the region (e.g., via induced anisotropy). Similarly, a strong magnetic field applied during the post-deposition high-temperature anneal step may be used to induce a preferred easy axis and a preferred pinning direction for any antiferromagnetically pinned materials.

Forming an MTJ device (such as MTJ device 1000A of FIG. 4A) with MTJ bits arranged in vertically spaced apart planes (e.g., vertically spaced apart arrays of MTJ bits 100A, 100B of FIG. 4A) improves MRAM bit density when compared to MTJ bits arranged in a single plane. Locating the MTJ bits in different planes improves the bit-bit spacing budget for manufacturability (e.g., etching) while allowing the area of a bit to be increased to improve performance (increase $E_b$, % sigma reduction, etc.) as compared to MTJ bits arranged in a single plane. Since the MTJ bits in different planes are formed or fabricated separately, the MTJ bits in different planes can be tuned (configured, material properties, shaped, sized, etc.) separately to have desired properties. MTJ device 1000A with the vertically spaced apart arrays of MTJ bits 100A, 100B also allows for 2 bit per transistor connection schemes (with adequate separation due to tuning possibilities) or in a 1-bit per transistor connection schemes.

In some embodiments, a magnetoresistive device is disclosed. The magnetoresistive device may include a first plurality of magnetic tunnel junction (MTJ) bits arranged in a first XY plane, and a second plurality of MTJ bits arranged in a second XY plane. The second XY plane may be spaced apart from the first XY plane in a Z direction. And, the MTJ bits of the first plurality of MTJ bits may be spaced apart from the MTJ bits of the second plurality of MTJ bits in the X and Y directions.

Various embodiments of disclosed magnetoresistive devices may, alternatively or additionally, include some of all of these following aspects: the MTJ bits of the first plurality of MTJ bits may have a different configuration than the MTJ bits of the second plurality of MTJ bits; the MTJ bits of the first plurality of MTJ bits may have a different shape than the MTJ bits of the second plurality of MTJ bits; the MTJ bits of the first plurality of MTJ bits may have a different size than the MTJ bits of the second plurality of MTJ bits; a cross-sectional shape of the MTJ bits of the first plurality of MTJ bits in the first XY plane is a first cross-sectional shape, and the cross-sectional shape of the MTJ bits of the second plurality of MTJ bits in the second XY plane may be a second cross-sectional shape different from the first cross-sectional shape; the first cross-sectional shape may be substantially circular and the second cross-sectional shape may be substantially square; the MTJ bits of the first plurality of MTJ bits may be spaced apart from each other in the X and Y directions by a first value, and the MTJ bits of the second plurality of MTJ bits may also be spaced apart from each other in the X and Y directions by the first value; the MTJ bits of the first plurality of MTJ bits may have a different energy barrier (Eb) than the MTJ bits of the second plurality of MTJ bits; an MTJ bit of the first plurality of MTJ bits may be equally spaced apart from four adjacent MTJ bits of the second plurality of MTJ bits.

In some embodiments, a magnetoresistive device is disclosed. The magnetoresistive device may include a first plurality of magnetic tunnel junction (MTJ) bits arranged in a first XY plane, and a second plurality of MTJ bits arranged in a second XY plane. The second XY plane may be spaced apart from the first XY plane in a Z direction, and MTJ bits of the first plurality of MTJ bits may be spaced apart from the MTJ bits of the second plurality of MTJ bits in the X and Y directions. And, an MTJ bit of the first plurality of MTJ bits may be equally spaced apart from four adjacent MTJ bits of the second plurality of MTJ bits.

Various embodiments of disclosed magnetoresistive devices may, alternatively or additionally, include some of all of these following aspects: the MTJ bits of the first plurality of MTJ bits may have a different configuration than the MTJ bits of the second plurality of MTJ bits; the MTJ bits of the first plurality of MTJ bits may have a different shape than the MTJ bits of the second plurality of MTJ bits; the MTJ bits of the first plurality of MTJ bits may have a different size than the MTJ bits of the second plurality of MTJ bits; a cross-sectional shape of the MTJ bits of the first plurality of MTJ bits in the first XY plane may be a first cross-sectional shape, and the cross-sectional shape of the MTJ bits of the second plurality of MTJ bits in the second XY plane may be a second cross-sectional shape different from the first cross-sectional shape; the first cross-sectional shape may be substantially circular and the second cross-sectional shape may be substantially square; the MTJ bits of the first plurality of MTJ bits may be spaced apart from each other in the X and Y directions by a first value, and the MTJ bits of the second plurality of MTJ bits may also be spaced apart from each other in the X and Y directions by the first value.

In some embodiments, a magnetoresistive device is disclosed. The magnetoresistive device may include a first plurality of magnetic tunnel junction (MTJ) bits arranged in a first XY plane and a second plurality of MTJ bits arranged in a second XY plane. The MTJ bits of the first plurality of MTJ bits may be spaced apart from each other in the X and Y directions by a first value, and the MTJ bits of the second plurality of MTJ bits may also be spaced apart from each other in the X and Y directions by the first value. The second XY plane may be spaced apart from the first XY plane in a Z direction. And, the MTJ bits of the first plurality of MTJ bits may be equally spaced apart from the MTJ bits of the second plurality of MTJ bits in X and Y directions.

Various embodiments of disclosed magnetoresistive devices may, alternatively or additionally, include some of all of these following aspects: the MTJ bits of the first plurality of MTJ bits may have a different configuration than the MTJ bits of the second plurality of MTJ bits; an MTJ bit of the first plurality of MTJ bits may be equally spaced apart from four adjacent MTJ bits of the second plurality of MTJ bits; a cross-sectional shape of the MTJ bits of the first plurality of MTJ bits in the first XY plane may be substantially circular, and the cross-sectional shape of the MTJ bits of the second plurality of MTJ bits in the second XY plane may be substantially square.

Although various embodiments of the present disclosure have been illustrated and described in detail, it will be readily apparent to those skilled in the art that various modifications may be made without departing from the present disclosure or from the scope of the appended claims.

What is claimed is:

1. A magnetoresistive device, comprising:
a first plurality of magnetic tunnel junction (MTJ) bits arranged in a first XY plane; and
a second plurality of MTJ bits arranged in a second XY plane, wherein (a) the second XY plane is spaced apart from the first XY plane in a Z direction, and (b) MTJ bits of the first plurality of MTJ bits are spaced apart from the MTJ bits of the second plurality of MTJ bits in X and Y directions.

2. The magnetoresistive device of claim 1, wherein the MTJ bits of the first plurality of MTJ bits have a different configuration than the MTJ bits of the second plurality of MTJ bits.

3. The magnetoresistive device of claim 1, wherein the MTJ bits of the first plurality of MTJ bits have a different shape than the MTJ bits of the second plurality of MTJ bits.

4. The magnetoresistive device of claim 1, wherein the MTJ bits of the first plurality of MTJ bits have a different size than the MTJ bits of the second plurality of MTJ bits.

5. The magnetoresistive device of claim 1, wherein a cross-sectional shape of the MTJ bits of the first plurality of MTJ bits in the first XY plane is a first cross-sectional shape, and the cross-sectional shape of the MTJ bits of the second plurality of MTJ bits in the second XY plane is a second cross-sectional shape different from the first cross-sectional shape.

6. The magnetoresistive device of claim 5, wherein the first cross-sectional shape is substantially circular and the second cross-sectional shape is substantially square.

7. The magnetoresistive device of claim 1, wherein the MTJ bits of the first plurality of MTJ bits are spaced apart from each other in the X and Y directions by a first value, and the MTJ bits of the second plurality of MTJ bits are also spaced apart from each other in the X and Y directions by the first value.

8. The magnetoresistive device of claim 1, wherein the MTJ bits of the first plurality of MTJ bits have a different energy barrier ($E_b$) than the MTJ bits of the second plurality of MTJ bits.

9. The magnetoresistive device of claim 1, wherein an MTJ bit of the first plurality of MTJ bits is equally spaced apart from four adjacent MTJ bits of the second plurality of MTJ bits.

10. A magnetoresistive device, comprising:
a first plurality of magnetic tunnel junction (MTJ) bits arranged in a first XY plane; and
a second plurality of MTJ bits arranged in a second XY plane, wherein (a) the second XY plane is spaced apart from the first XY plane in a Z direction, (b) MTJ bits of the first plurality of MTJ bits are spaced apart from the MTJ bits of the second plurality of MTJ bits in X and Y directions, and (c) an MTJ bit of the first plurality of MTJ bits is equally spaced apart from four adjacent MTJ bits of the second plurality of MTJ bits.

11. The magnetoresistive device of claim 10, wherein the MTJ bits of the first plurality of MTJ bits have a different configuration than the MTJ bits of the second plurality of MTJ bits.

12. The magnetoresistive device of claim 10, wherein the MTJ bits of the first plurality of MTJ bits have a different shape than the MTJ bits of the second plurality of MTJ bits.

13. The magnetoresistive device of claim 10, wherein the MTJ bits of the first plurality of MTJ bits have a different size than the MTJ bits of the second plurality of MTJ bits.

14. The magnetoresistive device of claim 10, wherein a cross-sectional shape of the MTJ bits of the first plurality of MTJ bits in the first XY plane is a first cross-sectional shape, and the cross-sectional shape of the MTJ bits of the second plurality of MTJ bits in the second XY plane is a second cross-sectional shape different from the first cross-sectional shape.

15. The magnetoresistive device of claim 14, wherein the first cross-sectional shape is substantially circular and the second cross-sectional shape is substantially square.

16. The magnetoresistive device of claim 10, wherein the MTJ bits of the first plurality of MTJ bits are spaced apart from each other in the X and Y directions by a first value, and the MTJ bits of the second plurality of MTJ bits are also spaced apart from each other in the X and Y directions by the first value.

17. A magnetoresistive device, comprising:
 a first plurality of magnetic tunnel junction (MTJ) bits arranged in a first XY plane, wherein the MTJ bits of the first plurality of MTJ bits are spaced apart from each other in the X and Y directions by a first value; and
 a second plurality of MTJ bits arranged in a second XY plane, wherein the MTJ bits of the second plurality of MTJ bits are spaced apart from each other in the X and Y directions by the first value, and wherein (a) the second XY plane is spaced apart from the first XY plane in a Z direction, and (b) MTJ bits of the first plurality of MTJ bits are equally spaced apart from the MTJ bits of the second plurality of MTJ bits in X and Y directions.

18. The magnetoresistive device of claim 17, wherein the MTJ bits of the first plurality of MTJ bits have a different configuration than the MTJ bits of the second plurality of MTJ bits.

19. The magnetoresistive device of claim 17, wherein an MTJ bit of the first plurality of MTJ bits is equally spaced apart from four adjacent MTJ bits of the second plurality of MTJ bits.

20. The magnetoresistive device of claim 17, wherein a cross-sectional shape of the MTJ bits of the first plurality of MTJ bits in the first XY plane is substantially circular, and the cross-sectional shape of the MTJ bits of the second plurality of MTJ bits in the second XY plane is substantially square.

* * * * *